(12) United States Patent
Litton et al.

(10) Patent No.: US 7,291,408 B2
(45) Date of Patent: *Nov. 6, 2007

(54) THERMAL BARRIER COATINGS WITH LOW THERMAL CONDUCTIVITY

(75) Inventors: David A. Litton, Rocky Hill, CT (US); Nicholas E. Ulion, Marlborough, CT (US); Mladen F. Trubelja, Manchester, CT (US); Michael J. Maloney, Marlborough, CT (US); Sunil Govinda Warrier, Middletown, CT (US)

(73) Assignee: United Technologies Corporation, Hartford, CT (US)

( * ) Notice: Subject to any disclaimer, the term of this patent is extended or adjusted under 35 U.S.C. 154(b) by 442 days.

This patent is subject to a terminal disclaimer.

(21) Appl. No.: 10/641,585

(22) Filed: Aug. 12, 2003

(65) Prior Publication Data

US 2004/0038085 A1 Feb. 26, 2004

Related U.S. Application Data

(63) Continuation-in-part of application No. 10/226,108, filed on Aug. 21, 2002, now Pat. No. 6,730,422.

(51) Int. Cl.
*B32B 18/00* (2006.01)
*B32B 15/04* (2006.01)

(52) U.S. Cl. ................. 428/702; 416/241 B; 428/633; 428/632; 428/699; 428/701

(58) Field of Classification Search ................. 428/633, 428/632, 679, 680, 697, 699, 701, 702, 332; 416/241 B
See application file for complete search history.

(56) References Cited

U.S. PATENT DOCUMENTS

| | | | |
|---|---|---|---|
| 3,634,113 A | 1/1972 | Fehrenbacher | |
| 3,957,500 A | 5/1976 | Pitts | |
| 4,535,033 A | 8/1985 | Stecura | |
| 4,774,150 A * | 9/1988 | Amano et al. ............... 428/690 |
| 4,939,107 A | 7/1990 | Ketcham | |
| 5,059,095 A * | 10/1991 | Kushner et al. ......... 416/241 B |
| 5,288,205 A | 2/1994 | Jones | |
| 5,514,482 A * | 5/1996 | Strangman .................. 428/623 |
| 5,658,837 A | 8/1997 | Quadir | |
| 5,789,330 A * | 8/1998 | Kondo et al. ............... 501/103 |
| 6,025,078 A | 2/2000 | Rickerby et al. | |
| 6,044,830 A | 4/2000 | Jones | |
| 6,117,560 A | 9/2000 | Maloney | |
| 6,127,006 A | 10/2000 | Schulz et al. | |
| 6,187,453 B1 | 2/2001 | Maloney | |
| 6,258,467 B1 | 7/2001 | Subramanian | |
| 6,284,323 B1 | 9/2001 | Maloney | |
| 6,333,090 B1 | 12/2001 | Schulz et al. | |
| 6,333,118 B1 | 12/2001 | Alperine et al. | |
| 6,558,814 B2 * | 5/2003 | Spitsberg et al. ........... 428/633 |
| 6,586,115 B2 * | 7/2003 | Rigney et al. ............... 428/633 |
| 6,730,422 B2 * | 5/2004 | Litton et al. ................. 428/701 |
| 6,812,176 B1 * | 11/2004 | Zhu et al. .................... 501/102 |
| 2003/0049470 A1 * | 3/2003 | Maloney ..................... 428/472 |
| 2004/0197580 A1 * | 10/2004 | Dorfman et al. ............ 428/472 |

FOREIGN PATENT DOCUMENTS

| | | |
|---|---|---|
| EP | 0 595 451 A1 | 5/1994 |
| EP | 0 812 931 A1 | 12/1997 |
| EP | 0 825 271 A1 | 2/1998 |
| EP | 1 249 515 A2 | 10/2002 |
| EP | 1 295 965 A2 | 3/2003 |
| WO | WO 97/01436 | 1/1997 |
| WO | WO 99/42630 | 8/1999 |
| WO | WO 02/14580 A2 | 2/2002 |

* cited by examiner

*Primary Examiner*—John J. Zimmerman
*Assistant Examiner*—Aaron Austin
(74) *Attorney, Agent, or Firm*—Bachman & LaPointe

(57) ABSTRACT

A ceramic material having particular utility as a thermal insulating or thermal barrier coating on metallic substrates is provided. The ceramic material broadly comprises at least one oxide and the balance comprising a first oxide selected from the group consisting of zirconia, ceria, and hafnia. The at least one oxide has a formula $A_2O_3$ where A is selected from the group consisting of La, Pr, Nd, Sm, Eu, Tb, In, Sc, Y, Dy, Ho, Er, Tm, Yb, Lu, and mixtures thereof. The present invention also broadly relates to an article having a metal substrate and a thermal barrier coating as discussed above.

36 Claims, No Drawings

THERMAL BARRIER COATINGS WITH LOW THERMAL CONDUCTIVITY

CROSS-REFERENCE TO RELATED APPLICATIONS

This application is a continuation in part of U.S. patent application Ser. No. 10/226,108, filed Aug. 21, 2002, now U.S. Pat. No. 6,730,422 entitled THERMAL BARRIER COATINGS WITH LOW THERMAL CONDUCTIVITY, by Litton et al.

BACKGROUND OF THE INVENTION

This invention relates to thermal barrier coatings made from ceramic materials and to metallic parts having such thermal barrier coatings. The thermal barrier coatings have particular utility in gas turbine engines.

Gas turbine engines are well developed mechanisms for converting chemical potential energy, in the form of fuel, to thermal energy and then to mechanical energy for use in propelling aircraft, generating electrical power, pumping fluids, etc. At this time, the major available avenue for improved efficiency of gas turbine engines appears to be the use of higher operating temperatures. However, the metallic materials used in gas turbine engines are currently very near the upper limits of their thermal stability. In the hottest portion of modem gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Such coatings are invariably based on ceramic. Mullite and alumina have been proposed, but zirconia is the current material of choice. Zirconia must be modified with a stabilizer to prevent the formation of the monoclinic phase. Typical stabilizers include yttria, calcia, ceria, and magnesia.

Generally speaking, metallic materials have coefficients of thermal expansion which exceed those of ceramic materials. Consequently, one of the problems that must be addressed in the development of successful thermal barrier coatings is to match the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Despite the success with thermal barrier coatings, there is a continuing desire for improved coatings which exhibit superior thermal insulation capabilities, especially those improved in insulation capabilities when normalized for coating density. Weight is always a critical factor when designing gas turbine engines, particularly rotating parts. Ceramic thermal barrier coatings are not load supporting materials, and consequently they add weight without increasing strength. There is a strong desire for a ceramic thermal barrier material which adds the minimum weight while providing the maximum thermal insulation capability. In addition, there are the normal desires for long life, stability and economy.

SUMMARY OF THE INVENTION

Accordingly, it is an object of the present invention to provide thermal barrier coatings having low thermal conductivity.

It is a further object of the present invention to provide thermal barrier coatings as above which have utility in gas turbine engines.

The foregoing objects are attained by the thermal barrier coatings of the present invention.

In accordance with a first embodiment of the present invention, a thermal barrier coating is provided which broadly comprises at least 15 mol % of at least one lanthanide sesquioxide and the balance comprising a first oxide selected from the group consisting of zirconia, ceria, and hafnia. The first oxide is preferably present in an amount greater than 50 mol %. The at least one lanthanide sesquioxide has a formula $A_2O_3$ where A is selected from the group consisting of La, Pr, Nd, Sm, Eu, Tb, and mixtures thereof.

Other embodiments of thermal barrier coatings in accordance with the present invention are included herein.

The present invention also relates to an article which broadly comprises a metal substrate and one of the above thermal barrier coatings. The article may have a bond coat intermediate the metal substrate and the thermal barrier coating.

Other details of the thermal barrier coatings of the present invention, as well as other objects and advantages attendant thereto, are set forth in the following detailed description.

DETAILED DESCRIPTION OF THE PREFERRED EMBODIMENT(S)

The essence of the present invention arises from the discovery that certain ceramic materials have great utility as thermal barrier coatings on metallic substrates, particularly those used to form components, such as the airfoils, of turbine engine components. These ceramic materials have such utility because they exhibit lower thermal conductivity that conventional thermal barrier coatings such as 7 weight % yttria stabilized zirconia.

In accordance with the present invention, a first embodiment of a thermal barrier coating which exhibits such a lower thermal conductivity comprises at least 15 mol % of at least one lanthanide sesquioxide and the balance comprising a first oxide selected from the group consisting of zirconia, ceria, and hafnia. Preferably the first oxide is present in an amount greater than 50 mol %. Each lanthanide sesquioxide has a formula $A_2O_3$ where A is selected from the group consisting of La, Pr, Nd, Sm, Eu, Th, and mixtures thereof. In a preferred embodiment, the at least one lanthanide sesquioxide is present in a total amount in the range of 15 to 45 mol %. In a most preferred embodiment, the at least one lanthanide sesquioxide is present in a total amount of at least 25 mol %. In the thermal barrier coatings of the present invention, where the first oxide is zirconia, each zirconium ion has more than one adjacent oxide vacancy on average, and preferably at least two adjacent oxide vacancies. If the first oxide is hafnia or ceria, each hafnium ion and each cerium ion would also have more than one adjacent oxide vacancy on average, and preferably at least two adjacent oxide vacancies. The presence of these oxygen vacancies minimizes the thermal conductivity of the coating. Thus, they are a highly desirable feature of the coatings of the present invention.

A second thermal barrier coating in accordance with the present invention comprises an oxide present in an amount from 5 to 60 mol % and the balance comprising a first oxide selected from the group consisting of zirconia, hafnia, and ceria. The oxide has a formula $A_2O_3$ where A is selected from the group consisting of In, Sc, Y, Dy, Ho, Er, Tm, Yb, Lu, and mixtures thereof. In a preferred embodiment of this coating, the lanthanide sesquioxide is present in an amount from 10 to 40 mol %.

A third embodiment of a thermal barrier coating comprises a lanthanide sesquioxide and the balance comprising a first oxide selected from the group consisting of zirconia, hafnia, ceria, and mixtures thereof. The lanthanide sesquioxide is present in an amount sufficient to create more than one oxygen vacancy on average adjacent each zirconium, hafnium, and cerium ions.

A fourth embodiment of a thermal barrier coating having a lower thermal conductivity in accordance with the present invention comprises from 15 to 60 mol % of a lanthanide sesquioxide having a formula $A_2O_3$ where A is selected from the group consisting of Er, Nd, Yb, Eu, Dy, Pr, Sm, La, and mixtures thereof, and the balance zirconia. The thermal barrier coating preferably contains less than 10 vol % of phases with a pyrochlore crystal structure. Zirconia is preferably present in an amount greater than 40 mol %. The thermal barrier coating may also contain one or more of the following constituents: from 0.001 to 2.5 mol % yttria, from 0.001 to 10 mol % of at least one of CaO and MgO, from 0.001 to 1.0 mol % $Yb_2O_3$, from 0.001 to 4.0 mol % $Sc_2O_3$, and/or from 0.001 to 4.0 mol % $In_2O_3$.

A fifth embodiment of a thermal barrier coating in accordance with the present invention which exhibits a lower thermal conductivity comprises at least 15 mol % yttria, and a lanthanide sesquioxide having a formula $A_2O_3$ where A is selected from the group consisting of Er, Nd, Yb, Eu, Dy, Gd, Pr, and mixtures thereof, and the balance zirconia. In a preferred embodiment, the zirconia is present in an amount greater than 40 mol % and the coating contains less than 10 vol% of phases with a pyrochlore crystal structure. The yttria in this coating system may be present in an amount in the range of 15 to 22 mol % and the lanthanide sesquioxide may be present in an amount from 1.0 to 35 mol %. In a particularly useful embodiment of this thermal barrier coating system, yttria is present in an amount greater than 22 mol % and the lanthanide sesquioxide is present in an amount from 1.0 to 38 mol %.

In a sixth embodiment of the present invention, a thermal barrier coating having a lower thermal conductivity comprises from 9 to 15 mol % $Yb_2O3$, and from 1.0 to 48 mol % of a lanthanide sesquioxide having a formula $A_2O_3$ where A is selected from the group consisting of Er, Nd, Eu, Dy, Gd, Pr, and mixtures thereof, and the balance zirconia. The zirconia is present in an amount greater than 40 mol % and the coating has less than 10 vol % of a pyrochlore crystal structure.

A seventh embodiment of a thermal barrier coating in accordance with the present invention comprises greater than 15 mol % $Yb_2O_3$ and a lanthanide sesquioxide having a formula $A_2O_3$ where A is selected from the group consisting of Er, Nd, Eu, Dy, Gd, Pr, and mixtures thereof, and the balance zirconia. The zirconia is preferably present in an amount greater than 40 mol %. Further, the coating preferably contains less than 10 vol % of phases with a pyrochlore crystal structure. The lanthanide sesquioxide may be present in an amount from 0.001 to 45 mol %.

In an eighth embodiment of the present invention, a thermal barrier coating is provided which comprises from 20 to 30 mol % $Sc_2O_3$ and a lanthanide sesquioxide having a formula $A_2O_3$ where A is selected from the group consisting of Er, Nd, Eu, Dy, Gd, Pr, and mixtures thereof, and the balance zirconia. As before, the zirconia is preferably present in an amount greater than 40 mol %. Further, the thermal barrier coating has less than 10 vol % of phases with a pyrochlore crystal structure. In a preferred embodiment, the lanthanide sesquioxide is present in an amount from 0.001 to 30 mol %.

In a ninth embodiment of the present invention, a thermal barrier coating is provided which comprises greater than 30 mol % $Sc_2O_3$, a lanthanide sesquioxide having a formula $A_2O_3$ where A is selected from the group consisting of Nd, Eu, Dy, Gd, Er, Pr, and mixtures thereof, and the balance zirconia. The zirconia is preferably present in an amount greater than 40 mol %. The thermal barrier coating may have less than 10 vol % of phases with a pyrochlore crystal structure. In a preferred embodiment, the lanthanide sesquioxide is present in an amount in the range of 0.001 to 30 mol %.

In a tenth embodiment of the present invention, a thermal barrier coating comprises from 11 to 20 mol % $In_2O_3$ and a lanthanide sesquioxide having a formula $A_2O_3$ where A is selected from the group consisting of Er, Nd, Eu, Dy, Gd, Pr, and mixtures thereof, and the balance zirconia. In a preferred embodiment, the lantanide sesquioxide is present in an amount from 0.001 to 36 mol %. The zirconia is preferably present in an amount greater than 40 mol %. The coating also preferably contains less than 10 vol % of phases with a pyrochlore structure.

In an eleventh embodiment, a thermal barrier coating is provided which comprises more than 20 mol % $In_2O_3$, and a lanthanide sesquioxide having a formula $A_2O_3$ where A is selected from the group consisting of Er, Nd, Eu, Dy, Gd, Pr, and mixtures thereof, and the balance zirconia. In this coating system, the zirconia is preferably present in an amount greater than 40 mol %, the lanthanide sesquioxide is preferably present in an amount from 0.001 to 40 mol %, and the coating contains less than 10 vol % of phases with a pyrochlore structure.

In a twelfth embodiment of the present invention, a thermal barrier coating comprises from 5 to 60 mol % of at least one of $La_2O_3$ and $Sm_2O_3$, from 5 to 60 mol % of at least one oxide having the formula $A_2O_3$ where A is selected from the group consisting of Sc, In, Y, Pr, Nd, Eu, Sm, Gd, Dy, Er, Yb, and mixtures thereof, and the balance zirconia. In this coating system, the zirconia is preferably present in an amount greater than 40 mol % and the coating contains less than 10 vol % of phases with a pyrochlore structure.

Other embodiments of thermal barrier coatings in accordance with the present invention include the following.

(13) A thermal barrier coating comprising from 0.5 to 22.5 mol % of at least one first oxide having a formula $A_2O_3$ where A is selected from the group consisting of La, Sm, Tb, Tm, and Lu combined with a second oxide selected from the group consisting of zirconia, hafnia, and ceria. In a preferred embodiment, the second oxide is present in an amount of at least 77.5 mol %. The coating may also contain from 0.5 to 59.5 mol % of at least one third oxide from the group consisting of $In_2O_3$, $Sc_2O_3$, $Y_2O_3$, MgO, CaO, and mixtures thereof with the second oxide being present in an amount greater than 40 mol % when the third oxide is present. Still further, the coating, in another variation, may contain from 0.5 to 22.5 mol % of at least one third oxide selected from the group consisting of $CeO_2$, $Pr_2O_3$, $Nd_2O_3$, $Eu_2O_3$, $Gd_2O_3$, $Dy_2O_3$, $Er_2O_3$, $Yb_2O_3$, and mixtures thereof, and the at least one first oxide and the at least one third oxide being present in a total content no greater than 22.5 mol %.

(14) A thermal barrier coating comprising from 0.5 to 1.0 mol % of at least one first oxide from the group consisting of $CeO_2$, $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, $Y_2O_3$, and mixtures thereof, combined with a second oxide selected from the group consisting of zirconia, hafnia, and ceria. The thermal barrier coating may also contain from 0.5 to 22.5 mol % of at least one third oxide selected from the group consisting of $La_2O_3$, $Sm_2O_3$, $Tb_2O_3$, $Tm_2O_3$, $Ho_2O_3$, $Lu_2O_3$, MgO, CaO, and mixtures thereof, with the at least one first oxide and the at least one third oxide being present in a total amount of no greater than 22.5 mol %, and the second oxide being present in an amount of at least 77.5 mol %.

(15) A thermal barrier coating comprising from 20.5 to 22.5 mol % of CeO2 combined with an oxide selected from the group consisting of zirconia, hafnia, and ceria. In a preferred embodiment, the oxide is present in an amount of at least 77.5 mol %.

(16) A thermal barrier coating comprising from 0.5 to 22.0 mol % of CeO2, and from 0.5 to 22.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Gd_2O_3$, $Dy_2O_3$, $Er_2O_3$, $Yb_2O_3$, and mixtures thereof, combined with a second oxide selected from the group consisting of zirconia and hafnia, and the $CeO_2$ and the at least one first oxide being present in an amount no greater than 22.5 mol %. In a preferred embodiment, the second oxide is present in an amount of at least 77.5 mol %.

(17) A thermal barrier coating comprising from 0.5 to 22.5 mol % $CeO_2$, from 0.5 to 59.5 mol % of at least one oxide selected from the group consisting of $In_2O_3$, $Sc_2O_3$, and mixtures thereof, combined with at least 40 mol % of an oxide selected from the group consisting of zirconia and hafnia.

(18) A thermal barrier coating comprising from 9.0 to 22.5 mol % of at least one first oxide selected from the group consisting of $Pr_2O_3$, $Nd_2O_3$, $Eu_2O_3$, $Er_2O_3$, and mixtures thereof combined with a second oxide selected from the group consisting of zirconia, hafnia, and ceria. In a preferred embodiment, the second oxide is present in an amount greater than 77.5 mol %. The thermal barrier coating may further comprise from 0.5 to 51.0 mol % of at least one third oxide selected from the group consisting of $Yb_2O_3$, $In_2O_3$, $Sc_2O_3$, $Y_2O_3$, $Gd_2O_3$, MgO, CaO, and mixtures thereof with the second oxide being present in an amount of at least 40 mol %.

(19) A thermal barrier coating comprising from 15.0 to 22.5 mol % of a first oxide selected from the group consisting of $Dy_2O_3$ and $Yb_2O_3$ combined with at least 77.5 mol % of a second oxide selected from the group consisting of zirconia, hafnia, and ceria.

(20) A thermal barrier coating comprising from 0.5 to 59.5 mol % of $Dy_2O_3$ and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

(21) A thermal barrier coating comprising from 0.5 to 22.5 mol % of $Yb_2O_3$, and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of zirconia, hafnia, and ceria.

(22) A thermal barrier coating comprising from 20.5 to 60 mol % of at least one oxide selected from the group consisting of $In_2O_3$, $Sc_2O_3$, and $Y_2O_3$, combined with at least 40 mol % of an oxide selected from the group consisting of zirconia, hafnia, and ceria.

(23) A thermal barrier coating comprising from 15 to 59.5 mol % of $Y_2O_3$, from 0.5 to 45.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

(24) A thermal barrier coating comprising from 9.0 to 23 mol % $Gd_2O_3$, from 0.5 to 51.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Dy_2O_3$, $Er_2O_3$, $Yb_2O_3$, $In_2O_3$, $Sc_2O_3$, and mixtures thereof, combined with at least 40 mol % of an oxide selected from the group consisting of zirconia, hafnia, and ceria.

The various thermal barrier coatings set forth herein may be characterized with a columnar structure.

An article, having particular utility as a component in a gas turbine engine, may be provided in accordance with the present invention. The article may have a metal substrate and one of the aforementioned thermal barrier coatings applied to the substrate. The thermal barrier coating may be applied directly to a surface of the substrate or may be applied to a bond coat deposited on one or more surfaces of the metal substrate. Any suitable technique known in the art may be used to deposit a thermal barrier coating in accordance with one of the embodiments of the present invention. Suitable techniques include electron beam physical vapor deposition, chemical vapor deposition, LPPS techniques, and diffusion processes. The metal substrate may comprise one of a nickel based superalloy, a cobalt based superalloy, a ferrous alloy such as steel, a titanium alloy, and a copper alloy.

The bond coat may comprise any suitable bond coat known in the art. For example, the bond coat may be formed from an aluminum containing material, an aluminide, a platinum aluminide, a ceramic material, such as 7 wt % yttria stabilized zirconia, or a MCrAlY material. The bond coat may be formed on the substrate using any suitable process known in the art including, but not limited to, low pressure plasma spray, electron beam physical vapor deposition, diffusion processes and chemical vapor deposition processes. If desired, the bond coat may have an oxide scale on an outer surface, which oxide scale consists essentially of alumina. The thermal barrier coatings of the present invention may be bonded to the oxide scale using any suitable technique known in the art.

If desired, a ceramic layer may be bonded to the thermal barrier coating. The additional ceramic material may be selected from the group consisting of materials which reduce oxygen diffusion, provide erosion and abrasion resistance, and/or provide optical emissivity of 0.7. Examples of high emissivity ceramic materials which can be used are alumina and mullite. High emissivity reduces the heat transfer across a thermal barrier coating by internal radiation (radiation of the thermal barrier coating material itself) due to the temperature difference between the hotter outer surface of the coating and the cooler interface between the coating and the TGO, thereby reducing the temperature of the TGO, thus the bondcoat, thus the alloy. Thus, high emissivity increases the insulative properties of the TBC. The additional ceramic layer may be formed over an exterior surface of the thermal barrier coating.

In some embodiments, the article may have an oxide scale on its surfaces and one of the thermal barrier coatings of the present invention may be applied directly over and bonded to the oxide scale using any suitable deposition technique known in the art including, but not limited to, diffusion processes, electron beam physical vapor deposition, and/or chemical vapor deposition techniques. The oxide scale may consist substantially of alumina.

Although the thermal barrier coatings of the present invention were developed for application in gas turbine engines, the coatings have utility in other applications where high temperatures are encountered, such as furnaces and internal combustion engines.

The following examples are intended to show the advantages of the coatings of the present invention.

EXAMPLE 1

Samples of 27.3 mole % $Y_2O_3$, balance $ZrO_2$, were produced by cold pressing and sintering of mixed powders to a density 95% of theoretical. The sample discs, 0.025" in thickness, were coated with graphite. Specific heat and thermal diffusivity measurements were made using the laser flash apparatus. Bulk density was determined by careful measurement of the sample dimensions and weight. Thermal conductivity values of 1.95 W/mK were calculated from the data measured at 1200° F., linearly corrected to theoretical density.

EXAMPLE 2

Samples of 16.7 mole % $Y_2O_3$, 16.7 mole % $Gd_2O_3$, balance $ZrO_2$, were similarly produced by cold pressing and sintering of mixed powders to a density 90.8% of theoretical. The 0.025"-thick samples were again coated with graphite and measured in the laser flash apparatus. From careful measurements of sample weight and dimensions, the bulk density of the sample was determined. Thermal conductivity values averaging 1.37 W/mK were calculated from the data measured at 1600° F., linearly corrected to theoretical density.

EXAMPLE 3

Coatings with an average composition of 19 mole % $Sm_2O_3$, balance $ZrO_2$, were deposited by electron beam physical vapor deposition onto alumina discs. High temperature measurements of thermal diffusivity were made in the laser flash apparatus. High temperature specific heat values were estimated from previous measurements of monolithic 33 mole % $Sm_2O_3$, balance $ZrO_2$ samples. Bulk density of the samples was calculated from the changes in weight and thickness of the discs during coating, and their diameters. Thermal conductivity values averaging 1.26 W/mK were calculated from the data measured at 1400° F., with no correction made for density.

It is apparent that there has been provided in accordance with the present invention thermal barrier coatings having low thermal conductivity which fully satisfy the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations as fall within the broad scope of the appended claims.

What is claimed is:

1. A thermal barrier coating comprising at least 15 mol % of at least one lanthanide sesquioxide, each said lanthanide sesquioxide having a formula of $A_2O_3$ where A is selected from the group consisting of La, Pr, Nd, Sm, Eu, Tb, and mixtures thereof, and the balance comprising ceria, said ceria being present in an amount of at least 50 mol %.

2. A thermal barrier coating according to claim 1, wherein said at least one lanthanide sesquioxide is present in a total amount in the range of 15-45 mol %.

3. A thermal barrier coating according to claim 1, wherein said at least one lanthanide sesquioxide is present in a total amount of at least 25 mol %.

4. A thermal barrier coating comprising from 0.5 to 22.0 mol % of $CeO_2$, and from 0.5 to 22.0 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, and mixtures thereof, combined with a second oxide selected from the group consisting of zirconia and hafnia, and said $CeO_2$ and said at least one first oxide being present in an amount no greater than 22.5 mol %.

5. A thermal barrier coating according to claim 4, wherein said second oxide is present in an amount of at least 77.5 mol %.

6. A thermal barrier coating consisting of from 0.5 to 22.0 mol % of at least one first oxide having a formula of $A_2O_3$ where A is selected from the group consisting of La, Sm, Tb, Tm, and Lu combined with a second oxide selected from the group consisting of hafnia, and ceria.

7. A thermal barrier coating according to claim 6, wherein said second oxide is present in an amount of at least 77.5 mol %.

8. A thermal barrier coating consisting of from 0.5 to 22.0 mol % of at least one first oxide having a formula of $A_2O_3$ where A is selected from the group consisting of La, Sm, Tb, Tm, and Lu combined with a second oxide selected from the group consisting of zirconia, hafnia, and ceria, and further consisting of from 0.5 to 59.5 mol % of at least one oxide selected from the group consisting of $In_2O_3$, $Sc_2O_3$, MgO, CaO, and mixtures thereof and said second oxide being present in an amount greater than 40 mol %.

9. A thermal barrier coating consisting of from 0.5 to 22.0 mol % of at least one first oxide having a formula of $A_2O_3$ where A is selected from the group consisting of La, Tb, Tm, and Lu combined with a second oxide selected from the group consisting of zirconia, hafnia, and ceria, and further consisting of from 0.5 to 22.0 mol % of at least one third oxide selected from the group consisting of $Pr_2O_3$, $Nd_2O_3$, $Eu_2O_3$, $Dy_2O_3$, $Er_2O_3$, $Yb_2O_3$, and mixtures thereof, and said at least one first oxide and said at least one third oxide being present in a total content up to 22.5 mol %.

10. A thermal barrier coating consisting of from 0.5 to 1.0 mol % of at least one first oxide from the group consisting of $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, and mixtures thereof, combined with a second oxide selected from the group consisting of hafnia, and ceria.

11. A thermal barrier coating consisting of from 0.5 to 1.0 mol % of at least one first oxide selected from the group consisting of $Pr_2O_3$, $Nd_2O_3$, $Eu_2O_3$, $Gd_2O_3$, $Dy_2O_3$, $Er_2O_3$, $Yb_2O_3$, $In_2O_3$, $Sc_2O_3$, and mixtures thereof, a second oxide selected from the group consisting of zirconia, hafnia, and ceria, and further consisting of from 0.5 to 22.0 mol % of at least one third oxide selected from the group consisting of $La_2O_3$, $Sm_2O_3$, $Tb_2O_3$, $Tm_2O_3$, $Ho_2O_3$, $Lu_2O_3$, MgO, CaO, and mixtures thereof, said at least one first oxide and said at least one third oxide being present in a total amount of up to 22.5 mol %, and said second oxide being present in an amount of at least 77.5 mol %.

12. A thermal barrier coating consisting of from 20.5 to 22.5 mol % of $CeO_2$ combined with hafnia.

13. A thermal barrier coating according to claim 12, wherein said hafnia is present in an amount of at least 77.5 mol %.

14. A thermal barrier coating consisting of from 0.5 to 22.5 mol % $CeO_2$, from 0.5 to 59.5 mol % of at least one oxide selected from the group consisting of $In_2O_3$, $Sc_2O_3$, and mixtures thereof, combined with at least 40 mol % of an oxide selected from the group consisting of zirconia and hafnia.

15. A thermal barrier coating consisting of from 9.0 to 22.5 mol % of at least one first oxide selected from the group consisting of $Pr_2O_3$, $Nd_2O_3$, $Eu_2O_3$, $Er_2O_3$, and mixtures thereof combined with a second oxide selected from the group consisting of hafnia, and ceria.

16. A thermal barrier coating according to claim 15, wherein said second oxide is present in an amount greater than 77.5 mol %.

17. A thermal barrier coating consisting of from 9.0 to 22.5 mol % of at least one first oxide selected from the group consisting of $Pr_2O_3$, $Nd_2O_3$, $Eu_2O_3$, $Er_2O_3$, and mixtures thereof combined with a second oxide selected from the group consisting of hafnia, and ceria, and further consisting of from 0.5 to 51 mol % of at least one third oxide selected from the group consisting of $Yb_2O_3$, $In_2O_3$, $Sc_2O_3$, MgO, CaO, and mixtures thereof and said second oxide being present in an amount of at least 40 mol %.

18. A thermal barrier coating consisting of from 15.0 to 22.5 mol % of a first oxide selected from the group consisting of $Dy_2O_3$ and $Yb_2O_3$ combined with at least 77.5 mol % of a second oxide selected from the group consisting of hafnia and ceria.

19. A thermal barrier coating consisting of from 0.5 to 59.9 mol % of $Dy_2O_3$ and from 0.5 to 59.5 mol % of at least one oxide from the group consisting of $In_2O_3$, $Sc_2O_3$, MgO, CaO, and mixtures thereof, combined with at least 40 mol % of ceria.

20. A thermal barrier coating comprising from 0.5 to 22.5 mol % of $Yb_2O_3$ and from 0.5 to 59.5 mol % of at least one oxide from the group consisting of $In_2O_3$, $Sc_2O_3$, MgO, CaO, and mixtures thereof, combined with at least 40 mol % of an oxide selected from the group consisting of hafnia and ceria.

21. A thermal barrier coating consisting of from 20.5 to 60 mol % of at least one oxide selected from the group consisting of $In_2O_3$, $Sc_2O_3$, and $Y_2O_3$, combined with at least 40 mol % of an oxide selected from the group consisting of hafnia and ceria.

22. A thermal barrier coating consisting of from 15 to 59.5 mol % of $Yb_2O_3$, from 0.5 to 45 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $In_2O_3$, $Sc_2O_3$, and mixtures thereof, combined with at least 40 mol % of ceria.

23. A thermal barrier coating consisting of from 9.0 to 23 mol % $Gd_2O_3$, from 0.5 to 51 mol % of at least one first oxide selected from the group consisting of $La_2O_3$, $Sm_2O_3$, $Tb_2O_3$, $Tm_2O_3$, $Ho_2O_3$, $Lu_2O_3$, MgO, CaO, $Pr_2O_3$, $Nd_2O_3$, $Eu_2O_3$, $Yb_2O_3$, $In_2O_3$, $Sc_2O_3$, and mixtures thereof, combined with at least 40 mol % of ceria.

24. A thermal barrier coating consisting of from 0.5 to 1.0 mol % of at least one first oxide from the group consisting of $Pr_2O_3$, $Nd_2O_3$, $Dy_2O_3$, $Er_2O_3$, $Yb_2O_3$, $In_2O_3$, $Sc_2O_3$, and mixtures thereof, combined with a second oxide selected from the group consisting of hafnia and ceria.

25. A thermal barrier coating consisting of from 0.5 to 1.0 mol % of at least one first oxide from the group consisting of $Pr_2O_3$, $Nd_2O_3$, $Eu_2O_3$, $Dy_2O_3$, $Er_2O_3$, $Yb_2O_3$, $In_2O_3$, $Sc_2O_3$, $Y_2O_3$, and mixtures thereof, and the balance ceria.

26. A thermal barrier coating consisting of from 9.0 to 22.5 mol % of at least one first oxide selected from the group consisting of $Pr_2O_3$, $Nd_2O_3$, $Eu_2O_3$, and mixtures thereof combined with a second oxide selected from the group consisting of hafnia, and ceria, and further consisting of from 0.5 to 51 mol % of at least one third oxide selected from the group consisting of $Yb_2O_3$, $In_2O_3$, $Sc_2O_3$, MgO, CaO, and mixtures thereof and said second oxide being present in an amount of at least 40 mol %.

27. A thermal barrier coating as claimed in any one of claims 6, 10, 12, 4, 14, 15, 17, 19, 20, 21, 22, 23, 24, 25, and 26, wherein said thermal barrier coating has a columnar structure.

28. An article having a metal substrate and a thermal barrier coating as claimed in any one of claims 6, 10, 12, 4, 14, 15, 17, 19, 20, 21, 22, 23, 24, 25, and 26.

29. An article according to claim 28, wherein said metal substrate comprises at least one of a nickel based superalloy, a cobalt based superalloy, a ferrous alloy, a titanium alloy, and a copper alloy.

30. An article according to claim 28, wherein said article comprises a component used on a turbine engine or an internal combustion engine.

31. An article according to claim 28, further comprising a ceramic bond coat between the thermal barrier coating and the metallic substrate.

32. An article according to claim 28, further comprising a bond coat intermediate said metal substrate and said thermal barrier coating.

33. An article according to claim 32, wherein said bond coat is formed from at least one of an aluminum containing material, an aluminide, a platinum aluminide, a MCrAlY material, and yttria stabilized zirconia.

34. An article according to claim 32, further comprising an additional ceramic layer on said thermal barrier coating, and said additional ceramic layer being formed from a material selected from the group consisting of materials which reduce oxygen diffusion, provide erosion and abrasion resistance, and/or have a level of optical emissivity of 0.7.

35. An article according to claim 28, wherein the metallic substrate has an oxide scale on an outer surface consisting substantially of alumina, and the thermal barrier coating is bonded to the oxide scale.

36. An article according to claim 35, wherein the bond coat has an oxide scale on its outer surface and the thermal barrier coating is bonded to the oxide scale on the outer surface.

* * * * *